United States Patent
Conte et al.

(10) Patent No.: US 6,650,147 B2
(45) Date of Patent: *Nov. 18, 2003

(54) SENSE AMPLIFIER WITH EXTENDED SUPPLY VOLTAGE RANGE

(75) Inventors: Antonino Conte, Tremestieri Etneo (FR); Nicolas Demange, Lessy (FR)

(73) Assignee: STMicroelectronics S.r.l., Agrate Brianza (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/249,833

(22) Filed: Feb. 12, 1999

(65) Prior Publication Data

US 2002/0000840 A1 Jan. 3, 2002

(30) Foreign Application Priority Data

Feb. 13, 1998 (EP) ............................................ 98-830067

(51) Int. Cl.[7] .............................................. G01R 19/00
(52) U.S. Cl. .............................. 327/51; 327/63; 327/72; 365/196; 365/207
(58) Field of Search ................................ 327/51–56, 63, 327/68, 70, 374–377, 72, 83, 88, 378; 365/185.21, 195, 196, 207, 205, 210, 211, 185.2, 189.11

(56) References Cited

U.S. PATENT DOCUMENTS

| | | | | |
|---|---|---|---|---|
| 5,390,147 A | * | 2/1995 | Smarandoiu et al. | 365/185.21 |
| 5,426,385 A | * | 6/1995 | Lai | 327/57 |
| 5,748,021 A | * | 5/1998 | Hunt et al. | 327/312 |

FOREIGN PATENT DOCUMENTS

| | | |
|---|---|---|
| EP | 0 320 779 A2 | 6/1989 |
| EP | 0 352 524 A2 | 1/1990 |
| EP | 0 477 369 A1 | 4/1992 |
| EP | 0 642 132 A2 | 3/1995 |

* cited by examiner

Primary Examiner—Minh Nguyen
(74) Attorney, Agent, or Firm—Lisa K. Jorgenson; Stephen Bongini; Fleit, Kain, Gibbons, Gutman & Bongini P.L.

(57) ABSTRACT

A sense amplifier for a memory includes a comparator and a bit line polarization circuit. The comparator receives a first signal representative of a current flowing through a memory cell and a second signal representative of a reference current. Additionally, the comparator includes a stage in a common source configuration and an active load for the stage, and the bit line polarization circuit provides a polarization voltage level that is independent of the supply voltage level. In a preferred embodiment, the sense amplifier also includes an output stage that improves switching time at high supply voltages.

22 Claims, 3 Drawing Sheets

SENSE AMPLIFIER WITH EXTENDED SUPPLY VOLTAGE RANGE

CROSS-REFERENCE TO RELATED APPLICATIONS

This application is based upon and claims priority from prior European Patent Application No. 98-830067.9, filed Feb. 13, 1998, the entire disclosure of which is herein incorporated by reference.

BACKGROUND OF THE INVENTION

1. Field of the Invention

The present invention relates to memory devices, and more specifically to a sense amplifier for memories that operate in an extended supply voltage range.

2. Description of Related Art

In the following description, reference is made to conventional terms used in MOS (Metal Oxide Semiconductor) transistor technology. For example, the term "gate" indicates the control electrode or input electrode of a MOS transistor, the term "drain" indicates the load electrode or output electrode, and the term "source" indicates the source electrode or output electrode. Further, the term "non-volatile" memory indicates a memory that does not lose stored data when the power supply is shut off, such as a ROM (Read Only Memory), EPROM (Erasable Programmable Read Only Memory), EEPROM (Electrically Erasable Programmable Read Only Memory), and EAROM (Electrically-Alterable Read Only Memory).

In EEPROM memories, data is stored by a transistor with a floating gate. A positive or negative electric charge is captured on the floating gate to modify the transistor threshold and store either a "0" or "1" logic state. If no charges are trapped on the floating gate, the memory cell is known as "virgin"; otherwise, it is known as "written" or "erased". The logic state, charge sign, and cell state (erased or written) depend on standards that can change from one product to another. The logic state of an EEPROM cell is detected based on the current that flows through the cell under known conditions.

If a negative charge is trapped on the floating gate, the cell threshold is higher than that of a virgin cell. On the other hand, if a positive charge is trapped, the threshold is lower. Generally, stored information is recovered by comparing a cell's current with the current of a virgin cell subject to the same conditions using an amplifier known as a "sense amplifier". In conventional sense amplifiers, this operation is carried out by a current/voltage conversion in two different branches in which such currents are flown. As shown in FIG. 1, convention sense amplifiers are typically based on a current mirror between the two branches.

In the conventional device, drains of memory cells CELL (which are organized in a matrix) are connected to a "bit line" BL, and a decoder (not shown) selects one of the cells. A circuit is connected to the bit line BL of the selected cell, and an identical circuit is connected to a virgin cell that is located outside of the matrix. The drain of the reference cell REF is connected in a fully symmetrical mode with the bit line BLREF. The currents from these two cells are converted into voltages VDREF and VDCELL through a current/voltage converter, which is formed by two transistors P1 and P2 (usually P-channel MOS transistors in a current mirror configuration as shown in FIG. 1).

The two voltages VDREF and VDCELL are supplied to the inputs of a differential comparator AMP that compares the voltages and delivers a logic value representative of the state of the cell being read. Generally, the differential comparator AMP is a classic source coupling differential stage NMOS with an active load represented by a PMOS transistor, as shown in FIG. 2. However, such a conventional configuration has limitations in low power applications as will be explained below. As shown in FIG. 1, on the reference side, a circuit is connected to the drain of the reference cell REF. This circuit includes an N-channel MOS transistor N1 whose control electrode is driven by an inverter INV1 that is controlled by the voltage on the reference bit line BLREF.

A polarization voltage for the bit line VBL is applied by this circuit (i.e., on the drain of the reference cell REF) with the bit line polarization voltage VBL being high enough to supply a voltage between the drain and source VDS to allow the cell to be read. The polarization voltage of the bit line VBL is a function of the threshold voltage or inversion of the inverter INV1 and the threshold voltage VTN1 of the transistor N1. A load such as the P-channel transistor shown in FIG. 1 connects the transistor drain N1 with the supply voltage VDD. The current IREF flowing through the reference cell REF and the transistor N1 is reflected in the sense amplifier for the cell being read. For this purpose, the transistor P1 is diode connected and reflects the current IREF1 in the other (identical) transistor P2.

The differential comparator AMP shown in FIG. 2 can operate linearly to ensure a correct comparison between the voltages VDREF and VDCELL, except this results in a lower limit for the voltage VDREF, which equals the voltage drop determined in the differential amplifier by the threshold voltage of the active load transistor, plus the overvoltage on the active load, plus the drain source voltage drop on the polarization transistor. At the same time, the voltage VDREF is a function of the supply voltage VDD less the voltage drop due to the threshold voltage of the transistor P1 and overdrive voltage due to the current mirror reflection IREF. Therefore, if the supply voltage VDD falls below 2 V, the differential comparator AMP of the conventional sense amplifier will not be able to operate correctly in its amplifying range. Because of this drawback, a different circuit is required to ensure an efficient functionality of the read operation at low supply voltages.

SUMMARY OF THE INVENTION

In view of these drawbacks, it is an object of the present invention to overcome the above-mentioned drawbacks and to provide a sense amplifier having a simple comparator scheme with good switching performance over an extended voltage range.

One embodiment of the present invention provides a sense amplifier that includes a comparator and a bit line polarization circuit. The comparator receives a first signal representative of a current flowing through a memory cell and a second signal representative of a reference current. Additionally, the comparator includes a stage in a common source configuration and an active load for the stage, and the bit line polarization circuit provides a polarization voltage level that is independent of the supply voltage level. In a preferred embodiment, the sense amplifier also includes an output stage that improves switching time at high supply voltages.

Another embodiment of the present invention provides a method for sensing logic levels in a memory device. According to the method, a bit line is polarized at a polarization voltage level, and a first signal representative of a current flowing through a memory cell is compared with a second signal representative of a reference current. The polarization voltage level is independent of the supply voltage level. In one preferred method, the polarization voltage level is generated using a steady current that is externally generated.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

In preferred embodiments of the present invention, a comparator is used in a common source stage and an output stage configuration to improve switching time with high supply voltages (e.g., VDD>5 V). This solution is based on the adoption of a bit line polarization that is independent with respect to VDD.

Figure 1:
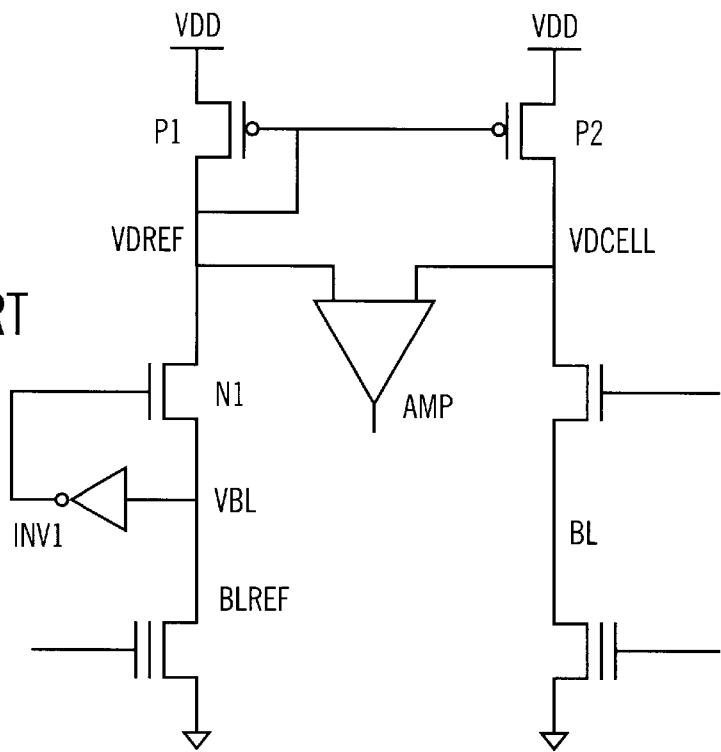
FIG. 1 shows a conventional sense amplifier.
Figure 2:
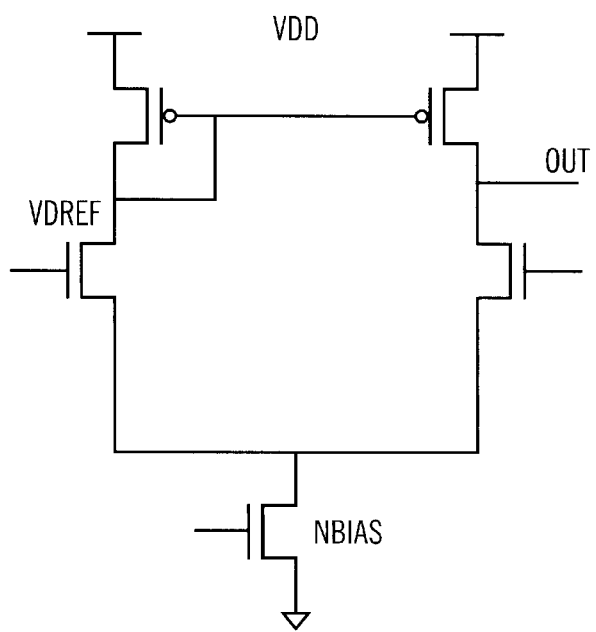
FIG. 2 shows a conventional source coupling differential stage NMOS.
Figure 3:
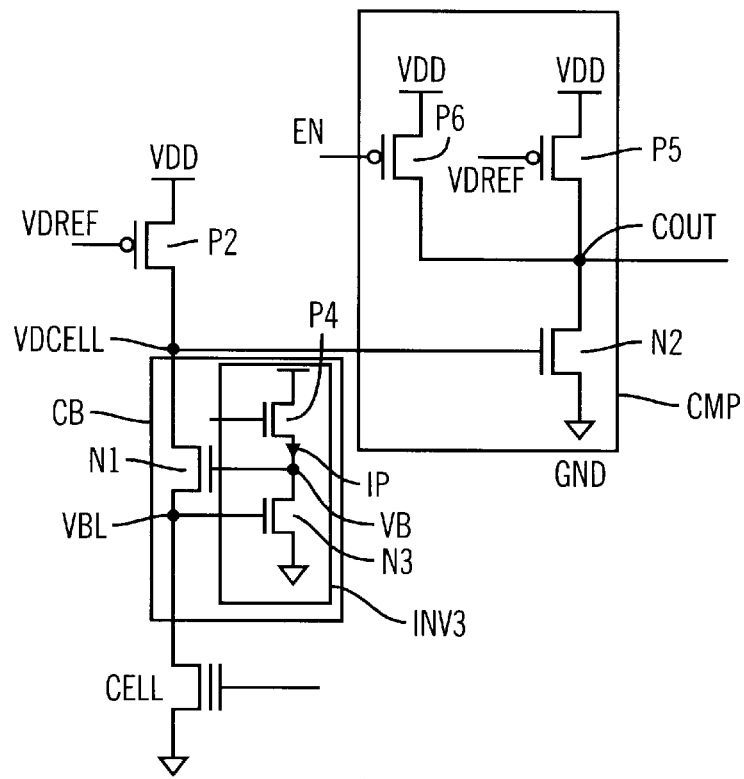
FIG. 3 shows a sense amplifier according to one embodiment of the present invention.

FIG. 3 shows a sense amplifier according to one embodiment of the present invention. As shown, the polarization voltage VB of the transistor N1 is supplied through the inverter circuit INV3 of a polarization circuit CB. The polarization circuit CB makes the polarization voltage VB of the transistor N1 and the polarization voltage of the bit line VBL independent with respect to the supply voltage VDD. The inverter circuit INV3 is a standard MOS inverter having an N-channel transistor N3 and a P-channel transistor P4. The NMOS transistor N3 of the inverter circuit INV3 is connected with the bit line BL as in the inverter INV1 of the conventional circuit of FIG. 1.

On the other hand, the PMOS transistor P4 is not connected with the bit line BL but operates according to the principle of a current mirror (i.e., the transistor P4 reflects a steady current IP generated separately through a current generator and injected at the gate of the transistor P4). For example, the transistor P4 may belong to a proper current mirror circuit in which a transistor reflects the current IP forced into another transistor connected with it through the gate. The value of the steady current IP is chosen with the purpose of maintaining the transistor P4 in saturation. Thus, the voltage VB on the gate of transistor N1 and consequently the polarization voltage of the bit line VBL (which is determined by the gate voltage VB) are independent from the supply voltage VDD, and instead depend on the steady current IP that is set according to the circuit requirements.

In other words, the polarization voltage VB of the transistor N1 is controlled using the steady current IP, which is generated separately. Thus, voltage VBL is independent from supply voltage VDD, so the supply voltage can be below 2 V without jeopardizing the operation of the inverter circuit INV3. Further, independence of the bit line polarization voltage VBL from the supply voltage VDD determines a consequent independence of the voltage VDCELL. For example, if a supply voltage VDD of 7 V is used, it is possible to design the inverter circuit INV3 so as to have a low voltage value (such as below 1 V) for voltage VBL. The use of a simple amplifier in a common source configuration with an active load can also ensure comparison at very low supply voltages.

As shown in FIG. 3, the sense amplifier includes a comparator circuit CMP with a common source amplifier that is obtained through a simple N-channel MOS transistor N2 and a relevant P-channel MOS transistor P5 that acts as an active load. The PMOS transistor P5 is maintained in saturation like the PMOS transistor P2. In this illustrative embodiment, the PMOS transistor P5 is driven by the voltage VDREF that also drives the PMOS transistor P2. Additionally, there is a P-channel MOS transistor P6 that is driven by an enable signal EN. When the enable signal EN is low, the PMOS transistor P6 allows the transistor drain that forms the common source amplifier to be brought to the supply voltage level VDD.

As shown in FIG. 3, if the reference current IREF is mirrored in the branch having the NMOS transistor N1, which is controlled by the polarization voltage VB obtained through the steady current IP as described above, it will force polarization of the bit line BL for the selected cell. As a result, the following two events can ensue.

(1) The current of the selected cell is higher than the reference current IREF, so the transistor N1 automatically adjusts its output voltage VDCELL to a level very close to the predetermined voltage level VBL.

(2) The cell has negative charges captured on its floating gate so the cell current is very low with respect to the reference current IREF, and thus the output voltage VDCELL on the drain of the transistor N1 is charged by the current IREF up to the supply voltage level VDD.

Under these conditions, the comparator CMP in the circuit of FIG. 3 can be sized to obtain a threshold voltage higher than the polarization voltage VBL of the bit line for the transistor N2 forming the amplifier. Thus, the comparator output COUT is set at the supply voltage level VDD in the case of event (1) and at the ground level GND in the case of event (2). This is possible because the supply voltage VDD is independent from the polarization voltage of the bit line VBL. As a result, the sense amplifier can advantageously operate in an extended supply voltage range. More specifically, because the polarization voltage VBL of the bit line does not depend on the level of the supply voltage VDD, it is always possible to choose amplifier dimensions so as to allow recognition of the logic states. Further, the comparator CMP of FIG. 3 has a good switching time.

However, such a simple circuit has a drawback in that at the beginning of each read operation, the output COUT of the comparator CMP has to be set to a known initial value. This is done through the PMOS transistor P6 driven by the enable signal EN, which for example can be derived from the disable signal that is usually applied to charge the bit line BL before a read operation. This initial value is preferably the value of the supply voltage VDD; otherwise, the time required for switching could be too high (being limited by the polarization current of the transistor P1 used as an active load).

Figure 4:
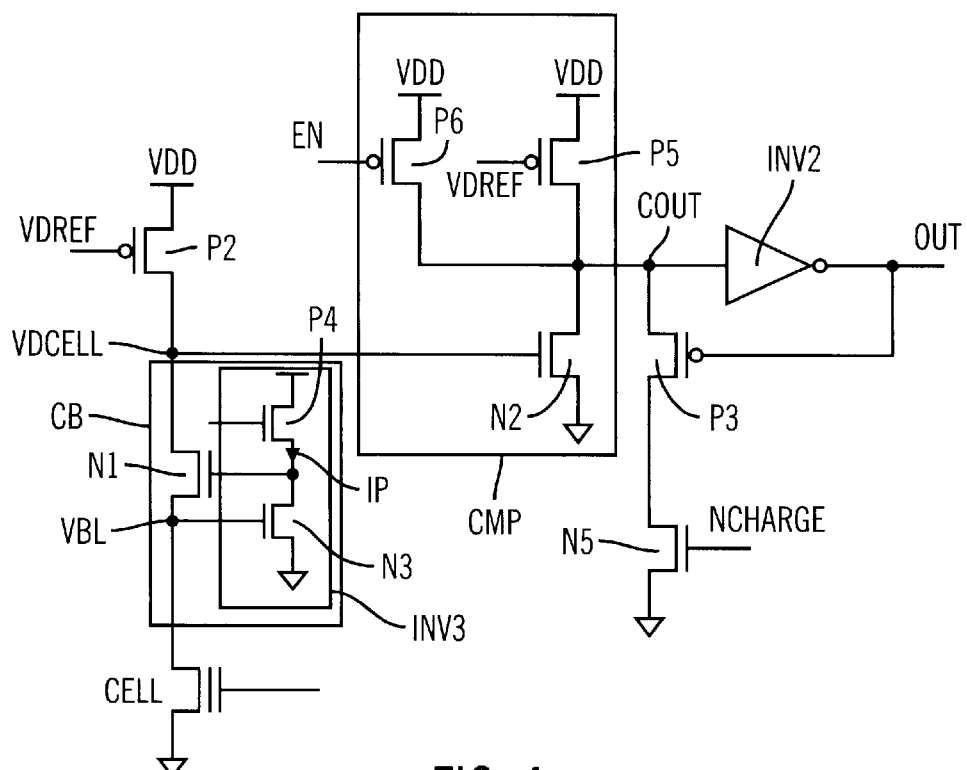
FIG. 4 shows a sense amplifier according to another embodiment of the present invention.

As a result, when the supply voltage VDD approaches 7 V, the initial value for the output of the comparator CMP is forced to 7 V. Thus, when switching takes place, the time required to switch from the supply voltage VDD to ground GND is higher than with lower supply voltages. FIG. 4 shows another embodiment of the present invention in which an improved switching time is obtained. In this embodiment, there is provided a P-channel MOS transistor P3 that is loop connected with an inverter INV2 that is in series with the comparator CMP. (The inverter can also be used as a buffer.) The loop is enabled by an N-channel MOS transistor N5 that is driven by a signal NCHARGE, which is at the high level only for the time required for switching.

At the beginning of a read operation, the signal NCHARGE goes high and brings the transistor N5 into conduction. Thus, the output COUT of the comparator CMP is precharged to about the threshold voltage of the inverter INV2. If the input voltage of the comparator CMP is higher than the threshold voltage (i.e., when reading a cell with a negative charge trapped on its floating gate), the output is already close to the threshold of the inverter INV2 so there is faster switching. At the end of the read operation, the signal NCHARGE is reset to limit the inverter to consumption only during the "sensing" time.

During the reading or "sensing" time, when the loop is enabled, the voltage at the output OUT is approximately given by the following equation.

$$VOUT = V_t - VSGP3 \qquad (1)$$

where Vt is the threshold voltage of the inverter INV2 and VSGP3 is the voltage between the gate and source of the PMOS transistor P3. Thus, the output voltage level VOUT is recognized as a low signal as in the absence of the loop with the signal NCHARGE at the low level.

Figure 5:
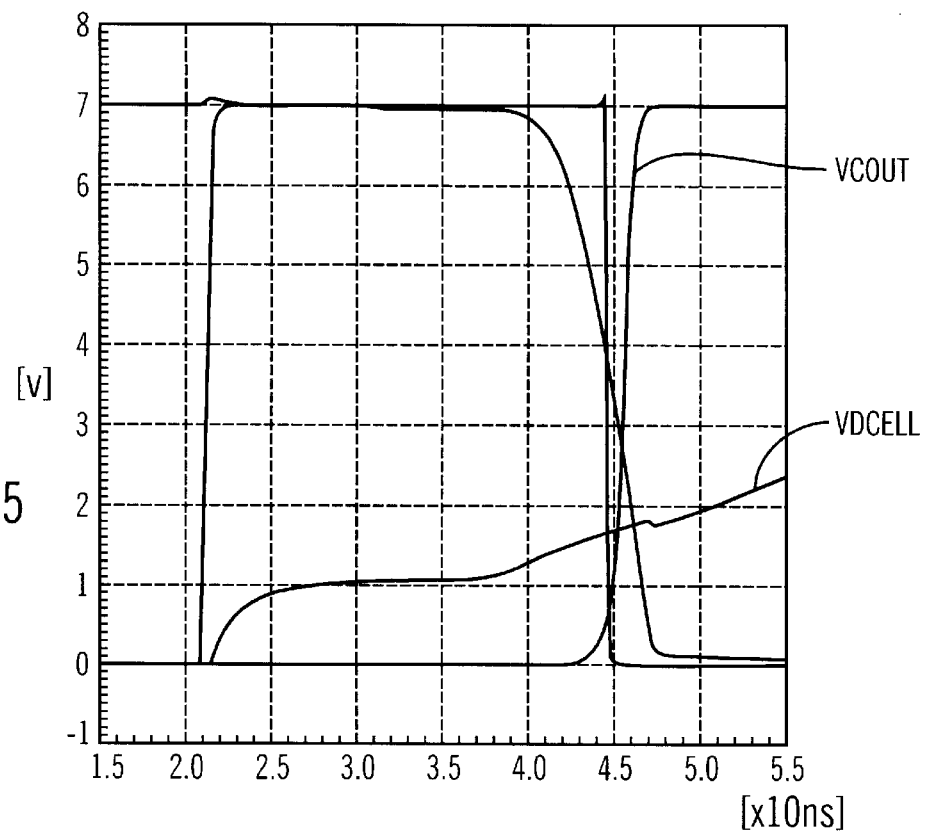
FIG. 5 shows voltage as a function of time for the sense amplifier of FIG. 3.
Figure 6:
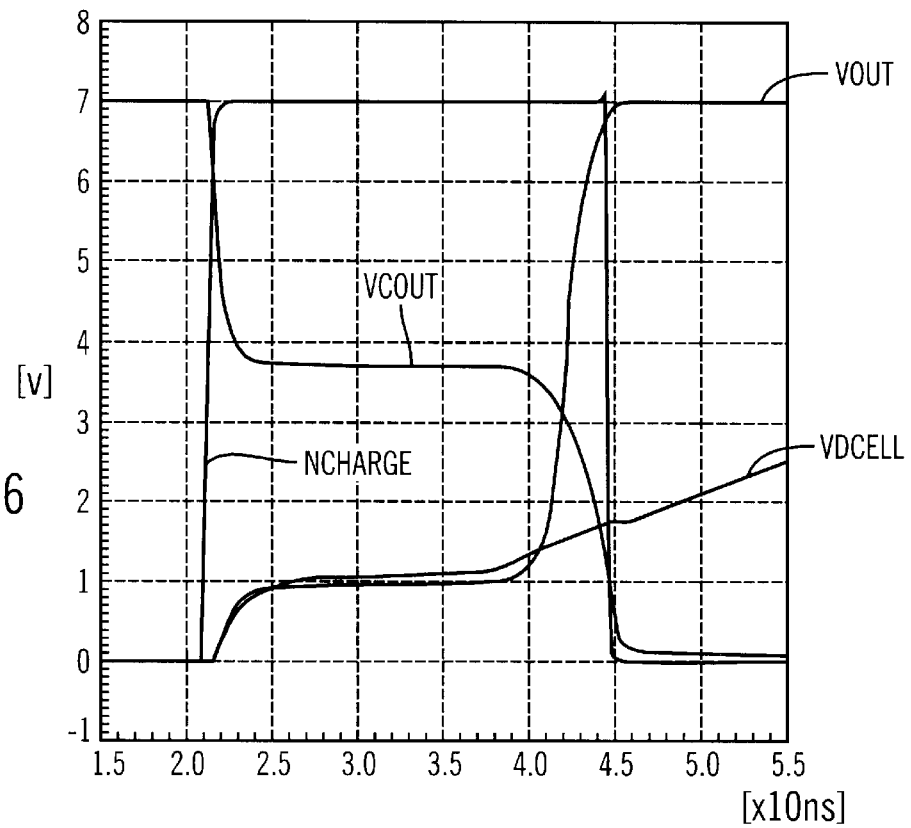
FIG. 6 shows voltage as a function of time for the sense amplifier of FIG. 4.

FIGS. 5 and 6 show the trend by simulation of several voltages related to the circuits of FIG. 3 (without loop) and FIG. 4 (with the loop), respectively. In particular, the trend of the output voltage VCOUT and the voltage VDCELL is shown in FIG. 5, and the trend related to the loop output voltage VOUT, the comparator output voltage VCOUT, the signal NCHARGE, and the voltage VDCELL is shown in FIG. 6. As shown in these two figures, with the loop, "sensing" time improves by about 3 ns at 5 V and about 4 nsec at 7 V (sensing time at 7 V ranges from about 24.2 to about 20.6 ns). FIG. 6 also illustrates the precharge effect of the node COUT. When the signal NCHARGE reaches the 7 V supply voltage, the node COUT changes from the 7 V level (to which it has been brought by transistor P6) to about 3.8 V (which corresponds to the threshold voltage of the inverter INV2), and then quickly drops towards ground GND as soon as the voltage VDCELL exceeds the threshold of the amplifier N2.

Embodiments of the present invention are based on a reliable control of the polarization voltage VBL of the bit line with respect to the supply voltage VDD to provide a good switching time across an extended range of supply voltage levels (e.g., from 1.8 V to 7 V). Further, in preferred embodiments, a loop is provided to improve switching time at the upper limit of the supply voltage range. The loop is preferably enabled only during the reading or "sensing" time so as to limit power consumption, which is especially important with high supply voltages. Further, enabling the loop does not affect the comparator output logic level. Among the large number of possible applications, the present invention is specially suited for use with a smart card, like a credit card.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, other embodiments of the present invention may not include all of the features described above. Therefore, it is intended that the present invention not be limited to the particular embodiments disclosed, but that the invention include all embodiments falling within the scope of the appended claims.

What is claimed is:

1. A memory device having a sense amplifier receiving a supply voltage level at a supply terminal, said memory device comprising:

a comparator for comparing a first signal and a second signal, the comparator having a first signal input for receiving the first signal, a second signal input for receiving the second signal, a common source amplifier coupled to the first signal input, and an active load for the common source amplifier;

a memory cell that is connected between ground and a first node;

a bit line polarization circuit coupled between the first node and the first signal input of the comparator for providing a polarization voltage level that is independent of the supply voltage level to the first node and converting the current flowing through the memory cell to the first signal received by the first signal input of the comparator;

a reference memory cell that is connected between ground and a second node, wherein a reference current flows through the reference memory cell and is used as a reference to define high and low logic states of an output of the comparator; and a circuit coupled between the second node and the second signal input of the comparator for converting the reference current to the second signal received by the second signal input of the comparator.

2. The memory device as defined in claim 1, further comprising an output stage coupled to the output of the comparator.

3. The memory device as defined in claim 2, wherein the output stage includes a loop having a transistor and an inverter.

4. The memory device as defined claim 1, wherein the bit line polarization circuit uses a steady current that is externally generated.

5. The memory device as defined in claim 1, wherein the bit line polarization circuit includes an inverter circuit coupled to a transistor, the transistor being coupled to the first node.

6. A sense amplifier for a memory, the sense amplifier receiving a supply voltage level at a supply terminal, said sense amplifier comprising:

a comparator having a common source stage and an active load for the common source stage, the comparator having a first signal input for receiving a first signal representative of a current flowing through a memory cell and a second signal input for receiving a second signal representative of a reference current;

a bit line polarization circuit providing a polarization voltage level that is independent of the supply voltage level, the bit line polarization circuit being coupled to a node that is coupled to the first signal input of the comparator; and an output stage coupled to an output of the comparator, wherein the output stage includes a loop having a transistor and an inverter, and the loop is enabled by a second transistor that is coupled to the transistor of the loop, the second transistor being driven by a signal that is only active substantially for the time required for switching.

7. A sense amplifier for a memory, the sense amplifier receiving a supply voltage level at a supply terminal, said sense amplifier comprising:

a comparator having a common source stage and an active load for the common source stage, the comparator having a first signal input for receiving a first signal representative of a current flowing through a memory cell and a second signal input for receiving a second signal representative of a reference current; and a bit line polarization circuit providing a polarization voltage level that is independent of the supply voltage level, the bit line polarization circuit being coupled to a node that is coupled to the first signal input of the comparator, wherein the bit line polarization circuit includes means for adjusting the first signal to a value very close to the polarization voltage level when the current flowing through the memory cell is higher than the reference current, and for bringing the first signal substantially to the supply voltage level when the current flowing through the memory cell is lower than the reference current, said means being coupled to the node.

8. The sense amplifier as defined in claim 7, further comprising an output stage coupled to an output of the comparator.

9. The sense amplifier as defined in claim 7, wherein the output of the comparator is at the supply voltage level if the current flowing through the memory cell is higher than the reference current, and the output of the comparator is at ground level if the current flowing through the memory cell is lower than the reference current.

10. A memory device having a sense amplifier receiving a supply voltage level at a supply terminal, said memory device comprising:

a memory cell that is connected between ground and a first node;

a comparator having a common source stage and an active load for the common source stage, the comparator having a first signal input for receiving a first signal representative of a current flowing through the memory cell and a second signal input for receiving a second signal representative of a reference current, the reference current being used as a reference to define high and low logic states; and a bit line polarization circuit coupled between the first node and the first signal input of the comparator for providing a polarization voltage level that is independent of the supply voltage level to the first node and converting the current flowing through the memory cell to the first signal received by the first signal input of the comparator, wherein a threshold voltage of the common source stage of the comparator is higher than the polarization voltage level of the first node.

11. An information handling system including at least one memory device that contains at least one sense amplifier, the sense amplifier receiving a supply voltage level at a supply terminal, said memory device comprising:

a comparator for comparing a first signal and a second signal, the comparator having a first signal input for receiving the first signal, a second signal input for receiving the second signal, a common source amplifier coupled to the first signal input, and an active load for the common source amplifier;

a memory cell that is connected between ground and a first node;

a bit line polarization circuit coupled between the first node and the first signal input of the comparator for providing a polarization voltage level that is independent of the supply voltage level to the first node and converting the current flowing through the memory cell to the first signal received by the first signal input of the comparator;

a reference memory cell that is connected between ground and a second node, wherein a reference current flows through the reference memory cell and is used as a reference to define high and low logic states of an output of the comparator; and a circuit coupled between the second node and the second signal input of the comparator for converting the reference current to the second signal received by the second signal input of the comparator.

12. The information handling system as defined in claim 11, wherein the sense amplifier further comprises an output stage coupled to the output of the comparator.

13. The information handling system as defined in claim 12, wherein the output stage includes a loop having a transistor and an inverter.

14. The information handling system as defined claim 11, wherein the bit line polarization circuit uses a steady current that is generated outside of the sense amplifier.

15. An information handling system including at least one memory device that contains at least one sense amplifier, the sense amplifier receiving a supply voltage level at a supply terminal, said sense amplifier comprising:

a comparator having a common source stage and an active load for the common source stage, the comparator having a first signal input for receiving a first signal representative of a current flowing through a memory cell and a first signal input for receiving a second signal representative of a reference current;

a bit line polarization circuit providing a polarization voltage level that is independent of the supply voltage level, the bit line polarization circuit being coupled to a node that is coupled to the first signal input of the comparator; and an output stage coupled to an output of the comparator, wherein the output stage includes a loop having a transistor and an inverter, and the loop is enabled by a second transistor that is coupled to the transistor of the loop, the second transistor being driven by a signal that is only active substantially for the time required for switching.

16. An information handling system including at least one memory device that contains at least one sense amplifier, the sense amplifier receiving a supply voltage level at a supply terminal, the sense amplifier comprising:

a comparator having a common source stage and an active load for the common source stage, the comparator having a first signal input for receiving a first signal representative of a current flowing through a memory cell and a first signal input for receiving a second signal representative of a reference current;

a bit line polarization circuit providing a polarization voltage level that is independent of the supply voltage level, the bit line polarization circuit being coupled to a node that is coupled to the first signal input of the comparator, wherein the bit line polarization circuit includes means for adjusting the first signal to a value very close to the polarization voltage level when the current flowing through the memory cell is higher than the reference current, and for bringing the first signal substantially to the supply voltage level when the current flowing through the memory cell is lower than the reference current, said means being coupled to the node.

17. The information handling system as defined in claim 16, wherein the sense amplifier further comprises an output stage coupled to an output of the comparator.

18. The information handling system as defined in claim 16, wherein the output of the comparator is at the supply voltage level if the current flowing through the memory cell is higher than the reference current, and the output of the comparator is at ground level if the current flowing through the memory cell is lower than the reference current.

19. An information handling system including at least one memory device that contains at least one sense amplifier, the sense amplifier receiving a supply voltage level at a supply terminal, said memory device comprising:

a memory cell that is connected between ground and a first node;

a comparator having a common source stage and an active load for the common source stage, the comparator having a first signal input for receiving a first signal representative of a current flowing through the memory cell and a second signal input for receiving a second signal representative of a reference current, the reference current being used as a reference to define high and low logic states; and a bit line polarization circuit coupled between the first node and the first signal input of the comparator for providing a polarization voltage level that is independent of the supply voltage level to the first node and converting the current flowing through the memory cell to the first signal received by the first signal input of the comparator, wherein a threshold voltage of the common source stage of the comparator is higher than the polarization voltage level of the first node.

20. A method for sensing logic levels in a memory device that receives a supply voltage level at a supply terminal, said method comprising the steps of:

providing a memory cell that is connected between ground and a first bit line and a reference memory cell that is connected between ground and a second bit line;

polarizing the first bit line at a bit line polarization voltage level; and comparing a first signal carried on the first bit line and representative of a current flowing through the memory cell and a second signal carried on the second bit line and representative of a reference current flowing through the reference memory cell, the reference current being used as a reference to define high and low logic states, wherein the bit line polarization voltage level is independent of the supply voltage level.

21. The method as defined claim 20, further comprising the steps of:

outputting at the supply voltage level if the current flowing through the memory cell is higher than the reference current, and outputting at ground level if the current flowing through the memory cell is lower than the reference current.

22. The method as defined claim 20, further comprising the step of generating the polarization voltage level using a steady current that is externally generated.

* * * * *